United States Patent
Takada et al.

(10) Patent No.: US 9,573,472 B2
(45) Date of Patent: Feb. 21, 2017

(54) BATTERY CONTROL SYSTEM AND VEHICLE CONTROL SYSTEM

(71) Applicants: HITACHI AUTOMOTIVE SYSTEMS, LTD., Ibaraki (JP); NISSAN MOTOR CO., LTD., Kanagawa (JP)

(72) Inventors: Masayuki Takada, Hitachinaka (JP); Akihiro Machida, Hitachinaka (JP); Norihiro Shinotsuka, Hitachinaka (JP); Hiroshi Morikawa, Hitachinaka (JP); Toshikazu Maeshima, Hitachinaka (JP); Shigeyuki Kiyota, Kanagawa (JP); Yoshiyuki Tanaka, Kanagawa (JP); Toyoki Iguchi, Kanagawa (JP); Hiroaki Saitou, Kanagawa (JP); Hiroaki Hashimoto, Kanagawa (JP)

(73) Assignees: Hitachi Automotive Systems, Ltd., Ibaraki (JP); Nissan Motor Co., Ltd., Kanagawa (JP)

( * ) Notice: Subject to any disclaimer, the term of this patent is extended or adjusted under 35 U.S.C. 154(b) by 0 days.

(21) Appl. No.: 14/909,600

(22) PCT Filed: Jul. 18, 2014

(86) PCT No.: PCT/JP2014/069232
§ 371 (c)(1),
(2) Date: Feb. 2, 2016

(87) PCT Pub. No.: WO2015/019834
PCT Pub. Date: Feb. 12, 2015

(65) Prior Publication Data
US 2016/0193925 A1  Jul. 7, 2016

(30) Foreign Application Priority Data

Aug. 9, 2013 (JP) ................. 2013-166803

(51) Int. Cl.
*B60L 3/00* (2006.01)
*B60L 3/04* (2006.01)
(Continued)

(52) U.S. Cl.
CPC ............... *B60L 3/0046* (2013.01); *B60L 3/04* (2013.01); *B60L 11/1861* (2013.01);
(Continued)

(58) Field of Classification Search
None
See application file for complete search history.

(56) References Cited

U.S. PATENT DOCUMENTS 9,385,543 B2 * 7/2016 Kachi .................... B60L 1/003
2005/0052155 A1 * 3/2005 Surig .................... H02J 7/0021
320/116
(Continued)

FOREIGN PATENT DOCUMENTS

| JP | 2004-134204 A | 4/2004 |
| JP | 2008-182779 A | 8/2008 |

(Continued)

*Primary Examiner* — Redhwan k Mawari
*Assistant Examiner* — Edward Torchinsky
(74) *Attorney, Agent, or Firm* — Volpe and Koenig, P.C.

(57) ABSTRACT

A battery control system connected to a battery equipped with an explosion-proofing mechanism for cutting off an electric current when the battery enters an overcharge state, including: a cell voltage detection unit that detects voltage at the battery; a storage unit that stores information pertaining to the battery conditions; an overcharge decision-making unit that makes a decision as to whether or not the battery is in an overcharge state; a storage control unit that engages the storage unit to store information pertaining to the overcharge state when the overcharge decision-making unit decides that the battery is in an overcharge state; and an explosion-proofing decision-making unit that decides that the explo- (Continued)

sion-proofing mechanism in the battery has actuated if the overcharge information is stored in the storage unit and the cell voltage detected by the cell voltage detection unit is lower than a predetermined lower limit value.

6 Claims, 9 Drawing Sheets

(51) Int. Cl.
    *B60L 11/18*     (2006.01)
    *H01M 10/48*     (2006.01)
    *G01R 31/36*     (2006.01)
    *H01M 10/42*     (2006.01)
    *H01M 2/34*     (2006.01)
    *H02J 7/00*     (2006.01)

(52) U.S. Cl.
    CPC ........ *B60L 11/1864* (2013.01); *G01R 31/362* (2013.01); *H01M 2/34* (2013.01); *H01M 10/425* (2013.01); *H01M 10/48* (2013.01); *H02J 7/0026* (2013.01); *H02J 7/0031* (2013.01); *B60L 2240/545* (2013.01); *B60L 2240/547* (2013.01); *B60L 2240/549* (2013.01); *G01R 31/3658* (2013.01); *H01M 2010/4271* (2013.01); *H01M 2200/00* (2013.01); *H01M 2220/20* (2013.01); *H02J 2007/0037* (2013.01); *Y02T 10/7005* (2013.01); *Y02T 10/7044* (2013.01); *Y02T 10/7061* (2013.01)

(56) References Cited

U.S. PATENT DOCUMENTS

2013/0271086 A1    10/2013  Mitsutani et al.
2014/0232302 A1*  8/2014  Tsushima .................. H02J 7/00
                                                             318/139
2016/0193925 A1*  7/2016  Takada .................. B60L 3/0046
                                                              701/22

FOREIGN PATENT DOCUMENTS

JP        2008-234903 A    10/2008
JP        2012-253861 A    12/2012
WO      2012/086057 A1    6/2012

* cited by examiner

FIG.6

| No. | ITEM | SIZE | REMARKS |
|---|---|---|---|
| 1 | CELL NUMBER (1-40) | 1 | CELL NUMBER ASSIGNED TO SELL WITH HIGHEST VOLTAGE IF A PLURALITY OF CELLS ARE IN OVERCHARGE STATE |
| 2 | CELL VOLTAGE | 2 | RESOLUTION: 1 mV/bit |
| 3 | SOC | 2 | RESOLUTION: 0.1%/bit |
| 4 | COUNTER | 2 | RESOLUTION: 1 COUNT/bit |

BATTERY CONTROL SYSTEM AND VEHICLE CONTROL SYSTEM

TECHNICAL FIELD

The present invention relates to a battery control system and a vehicle control system.

BACKGROUND ART

There are explosion-proofing mechanisms known in the related art that cut off an electric current flowing to a sealed secondary battery when it becomes overcharged resulting in an increase in the internal pressure, so as to prevent a further rise in the internal pressure. PTL1, for instance, discloses an explosion-proofing mechanism having a diaphragm that inverts when there is a rise in the internal pressure so as to break the connection inside the battery and thus cut off the electric current.

CITATION LIST

Patent Literature

PTL1: Japanese Laid Open Patent Publication No. 2004-134204

SUMMARY OF INVENTION

Technical Problem

Once an explosion-proofing mechanism such as that described above has actuated at a battery having the explosion-proofing mechanism installed therein, the particular battery must be isolated from other batteries where the explosion-proofing mechanisms thereof have not actuated and that isolated battery must be dealt with in an optimal manner. This means that it is necessary to be able to reliably determine that the explosion-proofing mechanisms has been actuated in a battery system configured with batteries of this type.

According to the 1st aspect of the present invention, a battery control system connected to a battery equipped with an explosion-proofing mechanism for cutting off an electric current when the battery enters an overcharge state, which controls conditions at the battery, comprises: a cell voltage detection unit that detects a cell voltage at the battery; a storage unit that stores information pertaining to the conditions at the battery; an overcharge decision-making unit that makes a decision as to whether or not the battery is in an overcharge state; a storage control unit that engages the storage unit to store overcharge information pertaining to the overcharge state at the battery when the overcharge decision-making unit decides that the battery is in an overcharge state; and an explosion-proofing decision-making unit that decides that the explosion-proofing mechanism in the battery has actuated if the overcharge information is stored in the storage unit at startup of the battery control system and the cell voltage detected by the cell voltage detection unit is lower than a predetermined lower limit value.

According to the 2nd aspect of the present invention, in the battery control system according to the 1st aspect, it is preferred that: the battery control system further comprises a failure detection unit that detects a failure in the cell voltage detection unit; and the explosion-proofing decision-making unit also decides that the explosion-proofing mechanism in the battery has actuated if the overcharge information is stored in the storage unit at startup of the battery control system and a failure at the cell voltage detection unit is detected by the failure detection unit.

According to the 3rd aspect of the present invention, in the battery control system according to the 1st or the 2nd aspect, it is preferred that: the battery control system further comprises an SOC calculation unit that calculates an SOC value for the battery; and the overcharge decision-making unit decides that the battery is in an overcharge state if the cell voltage detected by the cell voltage detection unit is equal to or higher than a predetermined overcharge voltage and the SOC value calculated by the SOC calculation unit is equal to or greater than a predetermined overcharge SOC.

According to the 4th aspect of the present invention, in the battery control system according to the 3rd aspect, it is preferred that the overcharge decision-making unit decides that the battery is in an overcharge state if a state in which the cell voltage is equal to or higher than the overcharge voltage has been sustained for a length of time equal to or longer than a predetermined time length and the SOC value calculated by the SOC calculation unit is equal to or greater than the predetermined overcharge SOC.

According to the 5th aspect of the present invention, in the battery control system according to any one of the 1st through 4th aspects, it is preferred that the overcharge information stored in the storage unit at startup of the battery control system is invalidated if the explosion-proofing decision-making unit decides that the explosion-proofing mechanism has not actuated.

According to the 6th aspect of the present invention, a vehicle control system comprises: a battery control system connected to a battery equipped with an explosion-proofing mechanism for cutting off an electric current when the battery enters an overcharge state, which controls conditions at the battery; and a vehicle control unit, connected with the battery control system, which controls traveling conditions of a vehicle, wherein: the battery control system comprises a cell voltage detection unit that detects a cell voltage at the battery, a storage unit that stores information pertaining to the conditions at the battery, an overcharge decision-making unit that makes a decision as to whether or not the battery is in an overcharge state, and a storage control unit that engages the storage unit to store overcharge information pertaining to the overcharge state at the battery when the overcharge decision-making unit decides that the battery is in an overcharge state; and the vehicle control unit decides that the explosion-proofing mechanism in the battery has actuated if the overcharge information is stored in the storage unit at startup of the vehicle and the cell voltage detected by the cell voltage detection unit is lower than a predetermined lower limit value.

Advantageous Effect of the Invention

According to the present invention, a reliable decision can be made that an explosion-proofing mechanism has been actuated in a battery system configured with batteries each equipped with the explosion-proofing mechanism.

DESCRIPTION OF EMBODIMENTS

First Embodiment

The following is a description of an embodiment of the present invention, given in reference to drawings. The embodiment will be described below in reference to an example of the present invention adopted in a battery system configuring a power source in a hybrid vehicle (HEV).

In addition, while the embodiment will be described by assuming that the present invention is adopted in conjunction with lithium-ion batteries, the present invention may be otherwise adopted in conjunction with nickel hydrogen batteries, lead-acid batteries, electric double layer capacitors or hybrid capacitors. It is to be noted that while the assembled battery in the embodiment described below is configured by connecting battery cells in series, the assembled battery may instead be configured by connecting in series groups of battery cells each comprised of battery cells connected in parallel or the assembled battery may be configured by connecting in parallel groups of battery cells each comprised of battery cells connected in series. Alternatively, the assembled battery may be configured with a single battery cell.

Figure 1:
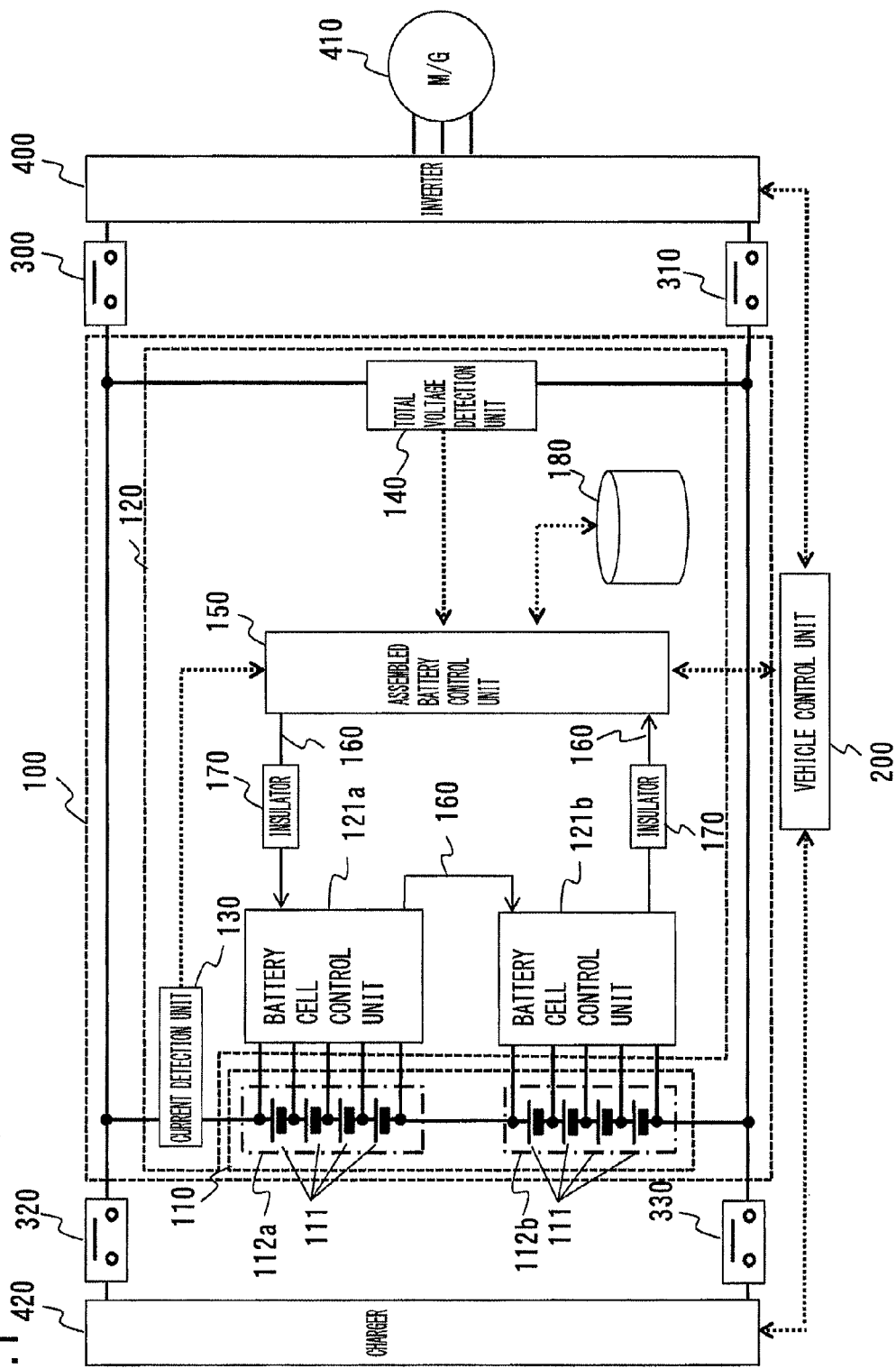
FIG. 1 A diagram showing a configuration comprising a battery system 100 that includes a battery control system 120 achieved in an embodiment of the present invention and peripheral devices FIG. 2 A diagram showing the circuit structure of the battery cell control unit 121*a*

FIG. 1 is a diagram showing a configuration comprising a battery system 100 that includes a battery control system 120 achieved in an embodiment of the present invention and peripheral devices. The battery system 100 is connected to an inverter 400 via relays 300 and 310. The battery system 100 comprises an assembled battery 110 and the battery control system 120. The battery control system 120 includes battery cell control units 121a and 121b, a current detection unit 130, a total voltage detection unit 140, an assembled battery control unit 150 and a storage unit 180.

The assembled battery 110 is configured by connecting in series battery cell groups 112a and 112b each made up with a plurality of battery cells 111. The battery cell control units 121a and 121b, which are respectively connected with the battery cell groups 112a and 112b, detect the cell voltages (voltages across the individual battery cells) and temperatures at the individual battery cells 111 in the corresponding battery cell groups and transmit signals indicating detection results to the assembled battery control unit 150 via signal communication paths 160 and insulator elements 170. It is to be noted that the insulator elements 170 may be constituted with, for instance, photo-couplers.

The current detection unit 130 detects the current flowing through each of the battery cells 111 and measures the value of the current. The total voltage detection unit 140 detects the voltage across the assembled battery 110, i.e., the voltage representing the total sum of the voltages at the battery cells 111 connected in series in the assembled battery 110.

Based upon the signals transmitted from the battery cell control units 121a and 121b, the assembled battery control unit 150 obtains the cell voltages and the temperatures at the individual battery cells 111. In addition, it individually receives the current value measured for the current flowing through the assembled battery 110 from the current detection unit 130 and the total voltage value for the assembled battery 110 from the total voltage detection unit 140. Based upon the information thus received, the assembled battery control unit 150 detects conditions at the assembled battery 110. The detection results indicating the conditions of the assembled battery 110 detected by the assembled battery control unit 150 are transmitted to a vehicle control unit 200 and to the battery cell control units 121a and 121b.

The assembled battery 110 is configured with a single battery cell 111 capable of accumulating and releasing electric energy (capable of charging/discharging DC power) or by electrically connecting in series a plurality of the battery cells 111. In order to facilitate management and control of the conditions at the battery cells 111 configuring the assembled battery 110, the battery cells 111 are divided into groups each made up with a predetermined unit number of cells. The battery cells 111 in each group are electrically connected in series and form the battery cell group 112a or 112b. It is to be noted that all the battery cell groups 112 may be made up with a uniform number of battery cells 111, or the number of battery cells 111 in a given battery cell group 112 may be different from the number of battery cells 111 in another battery cell group 112. For purposes of simplification, the embodiment will be described by assuming that the battery cell groups 112a and 112b, each formed by electrically connecting four battery cells 111 in series, are electrically connected in series in the assembled battery 110 having a total of eight battery cells 111 as illustrated in FIG. 1.

It is to be noted that the battery cells 111 in the assembled battery 110 each include an explosion-proofing mechanism installed therein so as to prevent any further increase in the internal pressure by cutting off the electric current if the battery becomes overcharged and the internal pressure rises. This explosion-proofing mechanism will be described in detail later.

The communication method adopted to enable the assembled battery control unit 150 to communicate with the battery cell control units 121a and 121b will be described next. The battery cell control units 121a and 121b are connected in series in an order conforming to the order in which the potentials at the battery cell groups 112a and 112b, respectively monitored by them, shift from high to low. A signal transmitted from the assembled battery control unit 150 is input to the battery cell control unit 121a via an insulator element 170 and a signal communication path 160. An output from the battery cell control unit 121a is input to the battery cell control unit 121b via a signal communication path 160. An output from the lowest-order battery cell control unit 121b is transmitted to the assembled battery control unit 150 via an insulator element 170 and a signal communication path 160. It is to be noted that while no insulator element is disposed between the battery cell control unit 121a and the battery cell control unit 121b in the embodiment, signals may be transmitted/received between these battery cell control units via an insulator element as well.

The storage unit 180 is a storage element capable of reading and writing various types of information under control executed by the assembled battery control unit 150. The storage unit 180 may be configured with, for instance, a non-volatile recording medium such as an EEPROM (electrically erasable programmable read only memory) or a flash memory. In the storage unit 180, various types of information pertaining to the conditions of the individual battery cells 111 configuring the assembled battery 110, needed by the assembled battery control unit 150 in order to control the assembled battery 110, are stored and held. For instance, information related to the state of charge (SOC) of each battery cell 111, information related to the internal resistance in each battery cell 111 and the like are stored in the storage unit 180.

The assembled battery control unit 150 executes various types of processing and arithmetic operations in order to control the assembled battery 110 by using information individually received from the battery cell control units 121a and 121b, the current detection unit 130, the total voltage detection unit 140 and the vehicle control unit 200, the information stored in the storage unit 180 and the like. It executes, for instance, arithmetic operations to determine the SOC and the state of health (SOH) of each of the battery cells 111 configuring the assembled battery 110, arithmetic operations to determine the allowable power that can be charged/discharged at the assembled battery 110, decision-making with regard to any abnormality in the assembled battery 110 and an arithmetic operation for purposes of charge/discharge quantity control at the assembled battery 110. Then, based upon the arithmetic operation results, it outputs information needed for control of the assembled battery 110 to the vehicle control unit 200 and to the battery cell control units 121a and 121b. It is to be noted that the assembled battery control unit 150 and the vehicle control unit 200 are both connected to an in-vehicle communication network referred to as a CAN (controller area network) and are thus able to transmit/receive information to/from each other via the network.

Whenever one of the battery cells 111 in the assembled battery 110 becomes overcharged, the assembled battery control unit 150 stores specific overcharge information corresponding to the particular better cell 111 into the storage unit 180. Subsequently, when the vehicle system is next started up, a decision is made based upon the overcharge information stored in the storage unit 180 as to whether or not the explosion-proofing mechanism in the battery cell 111 has been actuated. Through the processing executed by the assembled battery control unit 150 as described above, a decision pertaining to explosion-proofing mechanism actuation in the assembled battery 110 is made in the battery control system 120.

The vehicle control unit 200 controls the inverter 400 connected to the battery system 100 via the relays 300 and 310 by using the information transmitted thereto from the assembled battery control unit 150. While the vehicle is in a traveling state, the battery system 100 is connected to the inverter 400. The inverter 400 drives a motor generator 410 with the energy stored in the assembled battery 110 in the battery system 100.

When the vehicle system, having the battery system 100 installed therein, is started up and enters a traveling state, the battery system 100 becomes connected to the inverter 400 under management executed by the vehicle control unit 200. The inverter 400 then uses energy stored in the assembled battery 110 to drive the motor generator 410. In a regenerative operation, on the other hand, the assembled battery 110 is charged with power generated at the motor generator 410.

As the battery system 100 becomes connected to a charger 420 via relays 320 and 330, the assembled battery 110 is charged with a charge current provided from the charger 420 until a predetermined condition is satisfied. The energy stored in the assembled battery 110 through the charge operation is utilized when the vehicle is next engaged in traveling operation and is also utilized for operation of electric components and the like installed at the interior and exterior of the vehicle. Furthermore, the energy may be released into an external power system, a typical example of which is a home power system, as necessary. It is to be noted that the charger 420 is installed in an external power system, typical examples of which include a home power system and a public charging station. As the vehicle, having installed therein the battery system 100, is connected to any of these power systems, the battery system 100 and the charger 420 become connected based upon information provided by the vehicle control unit 200.

Figure 2:
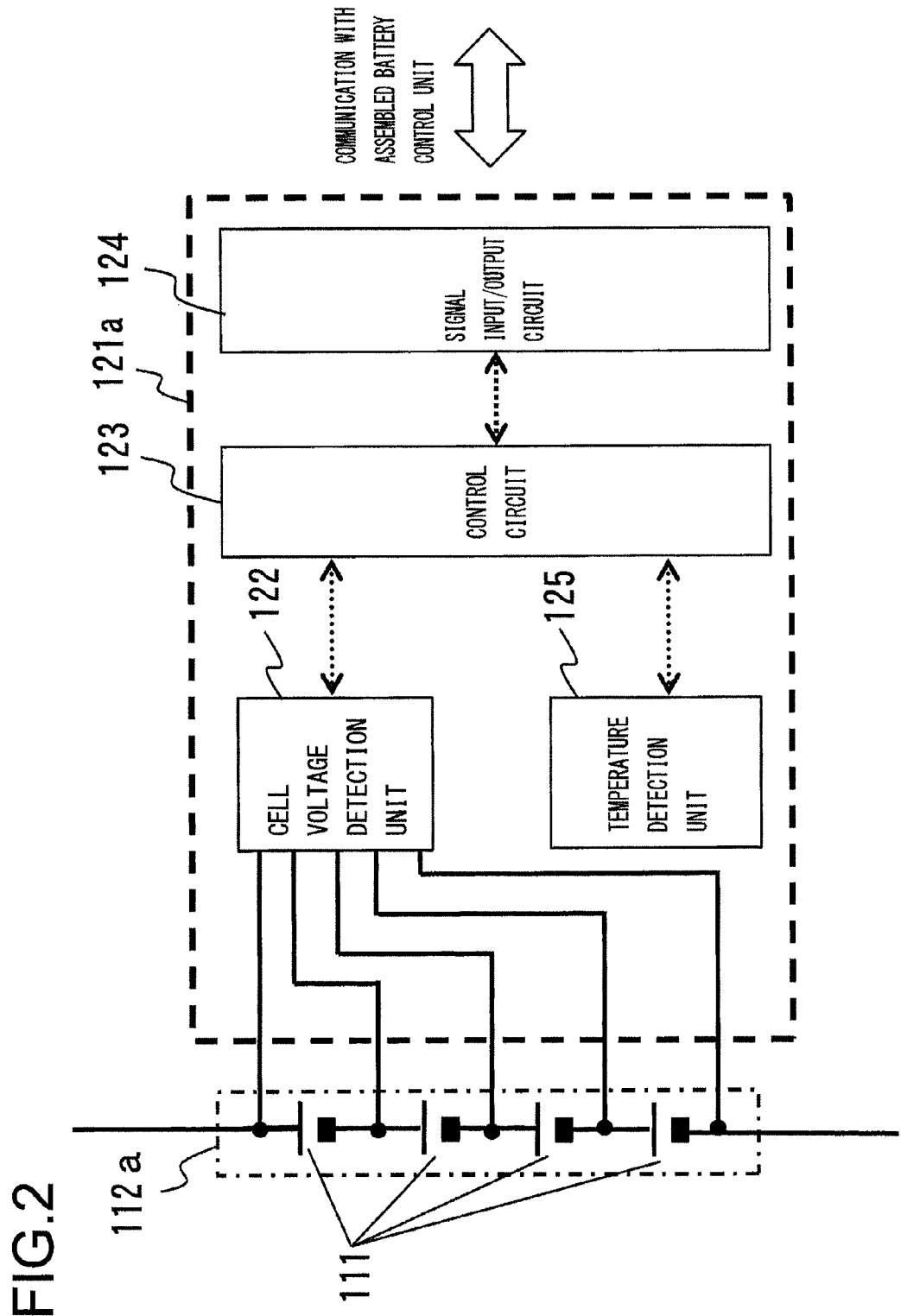

FIG. 2 is a diagram illustrating the circuit structure in the battery cell control unit 121a. As FIG. 2 shows, the battery cell control unit 121a comprises a cell voltage detection unit 122, a cell control circuit 123, a signal input/output circuit 124 and a temperature detection unit 125. It is to be noted that the battery cell control unit 121a and the battery cell control unit 121b in FIG. 1 assume circuit structures similar to each other. For this reason, the circuit structure in the battery cell control unit 121a alone is shown as a representative example in FIG. 2.

The cell voltage detection unit 122 measures the cell voltage (the voltage across the battery cell at each battery cell). The control circuit 123 receives the measurement results provided by the cell voltage detection unit 122 and the temperature detection unit 125 and transmits the measurement results thus received to the assembled battery control unit 150 via the signal input/output circuit 124. It is to be noted that although not shown in FIG. 2, the battery cell control unit 121a includes an equalizer circuit component of the known art that is used to minimize the variance among voltages and states of charge at the individual battery cells 111, attributable to self discharge, differences in the level of current consumed and the like. The operation of this circuit is controlled by the control circuit 123.

The temperature detection unit 125 in FIG. 2 has a function of measuring the temperature in the battery cell group 112a. The temperature detection unit 125 measures a single temperature for the entire battery cell group 112a and uses the temperature thus measured as a representative temperature value for the temperatures at the individual battery cells 111 forming the battery cell group 112a. The temperature measurement results provided by the temperature detection unit 125 are used for various types of arithmetic operations executed in the assembled battery control unit 150 in order to detect the states of the battery cells 111, the battery cell group 112a and the assembled battery 110. The temperature measured by the temperature detection unit 125 is used as the temperature at the individual battery cells 111 in the battery cell group 112a, as well as the temperature of the battery cell group 112a. In addition, the temperature of the assembled battery 110 may be determined by the assembled battery control unit 150 by, for instance, averaging the temperature of the battery cell group 112a measured by the temperature detection unit 125 in the battery cell control unit 121a and the temperature of the battery cell group 112*b* measured by the temperature detection unit 125 in the battery cell control unit 121*b*.

It is to be noted that FIG. 2 shows a single temperature detection unit 125 installed in the battery cell control unit 121*a*. However, the present invention is not limited to this example and a temperature detection unit 125 may be disposed in correspondence to each battery cell 111 so as to measure the temperature at the particular battery cell 111 and enable the assembled battery control unit 150 to execute various types of arithmetic operations based upon the measurement results corresponding to the individual battery cells. However, it must be borne in mind that a greater number of temperature detection units 125 in this alternative is bound to complicate the structure of the battery cell control unit 121*a*. As a further alternative, a single temperature detection unit 125 may be installed for the entire assembled battery 110.

It is to be noted that while the temperature detection unit 125 is shown as a single block for schematic representation in FIG. 2, a temperature sensor is installed in conjunction with the battery cell group 112*a*, i.e., the temperature measurement target, and this temperature sensor outputs the temperature information as a voltage signal in the actual configuration. The control circuit 123 executes an arithmetic operation to determine the temperature of the battery cell group 112*a* based upon the voltage signal and temperature measurement results for the battery cell group 112*a* are thus obtained. The temperature measurement results of the arithmetic operation executed by the control circuit 123 are transmitted to the signal input/output circuit 124, which, in turn, outputs the temperature measurement results to a recipient outside the battery cell control unit 121*a*. The function enabling this flow of processing is included as the temperature detection unit 125 in the battery cell control unit 121*a*. It is to be noted that the voltage signal output from the temperature sensor may be measured by the cell voltage detection unit 122 instead.

Figure 3:
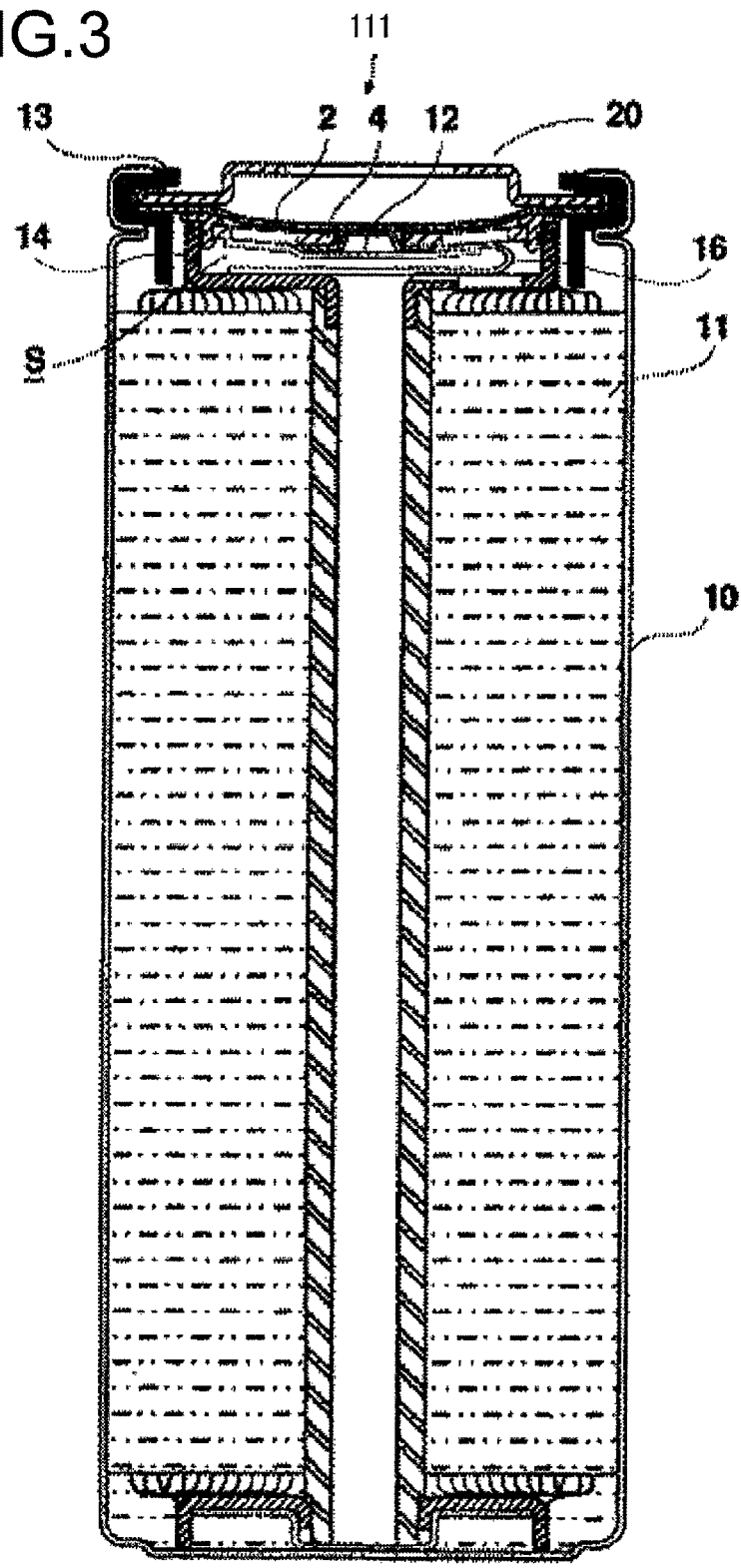
FIG. 3 An illustration presenting an example of an explosion-proofing mechanism that may be installed in a battery cell 111

The explosion-proofing mechanism installed in each battery cell 111 in the assembled battery 110 will be described next. FIG. 3 presents an example of the explosion-proofing mechanism included in a battery cell 111. The battery cell 111 in FIG. 3 has an electrode-winding group 11 housed in a central area within a cell case 10. A saucer-shaped diaphragm 2, a flat, doughnut-shaped splitter 4, a positive lead plate 12, a positive electrode current collector ring 14, a positive lead piece 16 and a top cover 20 are disposed above the electrode winding group 11. The top cover 20 is fastened at its circumferential edge to the cell case 10 through caulking via a gasket 13.

A connector plate having a projecting portion formed at the center thereof is disposed between the diaphragm 2 and the positive lead plate 12. The upper surface of the projecting portion of the connector plate and the bottom surface at the central area of the diaphragm 2, holding the splitter 4 disposed along the diaphragm 2 between them, are electrically and mechanically connected through resistance welding. The area of the diaphragm 2, along which the splitter 4 is disposed, and the splitter 4 are housed inside the positive electrode current collector ring 14.

When the battery cell 111 becomes overcharged and the internal pressure reaches a specific level, the diaphragm 2 inverts toward the top cover 20 and the connector plate is thereby ruptured, cutting off the electric current flowing through the battery cell 111. Through this process, the explosion-proofing mechanism in the battery cell 111 is actuated. PTL1 (Japanese Laid Open Patent Publication No. 2004-134204) discloses an explosion-proofing mechanism such as that described above.

It is to be noted that the explosion-proofing mechanism in the battery cell 111 is not limited to that described above. Namely, the battery cell 111 may include any explosion-proofing mechanism as long as it is capable of preventing any further increase in the internal pressure by cutting off the current flowing through the battery cell 111 after the battery cell 111 becomes overcharged and the internal pressure starts to increase.

Next, decision-making pertaining to explosion-proofing mechanism actuation in the assembled battery 110 will be described. The assembled battery control unit 150 makes a decision with respect to explosion-proofing mechanism actuation in the assembled battery 110 through the processing executed as explained earlier. Namely, whenever any of the battery cells 111 in the assembled battery 110 becomes overcharged, overcharge information corresponding to the particular battery cell 111 is stored into the storage unit 180. In addition, if overcharge information is stored in the storage unit 180 at startup of the vehicle system, the battery cell 111, having entered an overcharge state, is identified based upon the overcharge information and a decision is made as to whether or not the explosion-proofing mechanism has been actuated in the battery cell 111.

Figure 4:
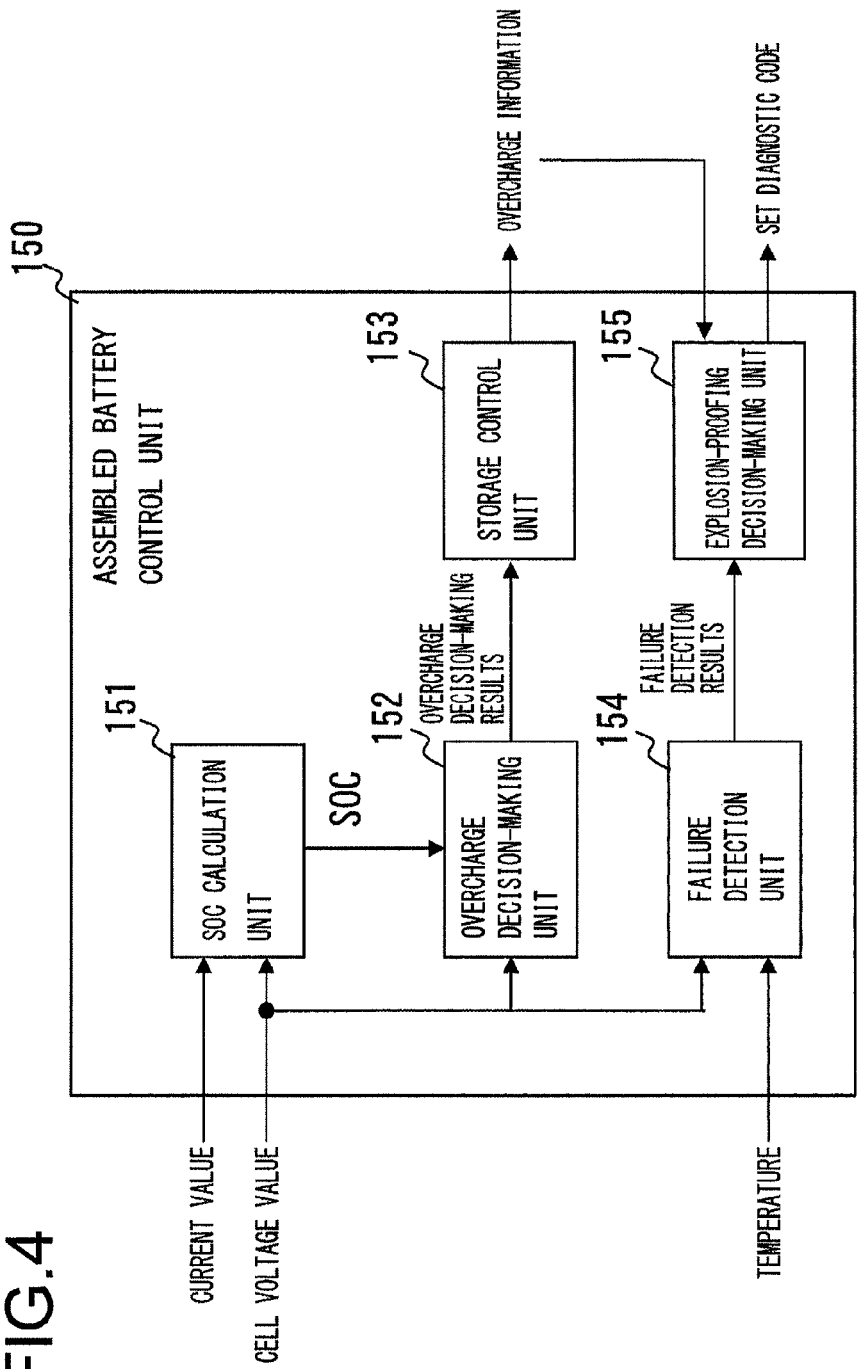
FIG. 4 A diagram showing control blocks in the assembled battery control unit 150, which are involved in decision-making with regard to explosion-proofing mechanism actuation FIG. 5 A flowchart of the abnormal cell detection processing executed in a first embodiment of the present invention FIG. 6 A chart presenting an example of overcharge information FIG. 7 A flowchart of the explosion-proofing mechanism actuation diagnostic processing executed in the first embodiment of the present invention FIG. 8 A flowchart of the abnormal cell detection processing executed in a second embodiment of the present invention FIG. 9 A flowchart of the explosion-proofing mechanism actuation diagnostic processing executed in a third embodiment of the present invention

FIG. 4 is a diagram showing the control blocks in the assembled battery control unit 150, which are involved in the decision-making for explosion-proofing mechanism actuation. The structural elements in the assembled battery control unit 150, which enable the decision-making for explosion-proofing mechanism actuation in the assembled battery 110, include the following functional control blocks; an SOC calculation unit 151, an overcharge decision-making unit 152, a storage control unit 153, a failure detection unit 154 and an explosion-proofing decision-making unit 155.

Current values, each measured by the current detection unit 130 in correspondence to one of the battery cells 111, and cell voltage values at the individual battery cells 111, individually measured by the cell voltage detection units 122 in the battery cell control units 121*a* and 121*b*, are input to the SOC calculation unit 151. Based upon the values input thereto, the SOC calculation unit 151 calculates the SOC at each battery cell 111. For instance, it is able to calculate an SOC value for each battery cell 111 based upon, for instance, the value representing the cell voltage at the battery cell 111 measured while charge/discharge is suspended, i.e., the open circuit voltage value, or based upon a cumulative value for the electric current flowing through the battery cell 111 during charge/discharge. SOC values calculated by the SOC calculation unit 151 in correspondence to the individual battery cells 111 are output to the overcharge decision-making unit 152.

The overcharge decision-making unit 152 makes a decision, based upon the cell voltage values at the battery cells 111 and the SOC values having been calculated by the SOC calculation unit 151 in correspondence to the individual battery cells 111, as to whether or not the battery cells 111 are each in an overcharge state. The overcharge decision-making results corresponding to the various battery cells 111, obtained via the overcharge decision-making unit 152, are output to the storage control unit 153.

Based upon the overcharge decision-making results for the individual battery cells 111, having been output by the overcharge decision-making unit 152, the storage control unit 153 identifies any battery cell 111 determined to be in an overcharge state. It then obtains information pertaining to the overcharge state at the particular battery cell 111 and stores it as overcharge information into the storage unit 180.

The cell voltage values and the temperatures at the individual battery cells 111 having been measured respectively by the cell voltage detection units 122 and the temperature detection units 125 in the battery cell control units 121*a* and 121*b*, are input to the failure detection unit 154. The failure detection unit 154 detects a failure in a specific part of the battery cell control unit 121*a* or 121*b* based upon the values input thereto. For instance, if the cell voltage measured for a given battery cell 111 takes abnormal values continuously, it is able to decide that a failure has occurred in the corresponding cell voltage detection unit 122. In addition, the cell voltage measurement results or the temperature measurement results cannot be obtained from the battery cell control unit 121*a* or 121*b* due to a communication error, it is able to decide that the control circuit 123 or the signal input/output circuit 124 has failed. A failure in the individual components can be detected by any of various methods other than that described above.

Based upon the overcharge information stored into the storage unit 180 by the storage control unit 153 and the failure detection results pertaining to the battery cell control units 121*a* and 121*b*, output by the failure detection unit 154, the explosion-proofing decision-making unit 155 makes a decision as to whether or not the explosion-proofing mechanism in any battery cell 111 has been actuated. If it is decided that the explosion-proofing mechanism in a battery cell 111 has been actuated, it sets a predetermined diagnostic code and outputs the diagnostic code thus set to the vehicle control unit 200.

Via the control blocks described above, the assembled battery control unit 150 is able to make a decision with respect to explosion-proofing mechanism actuation at the assembled battery 110.

Next, the processing executed by the assembled battery control unit 150 will be described in detail. The assembled battery control unit 150 engages the various control blocks shown in FIG. 4 in execution of abnormal cell detection processing and explosion-proofing mechanism actuation diagnostic processing. The abnormal cell detection processing, executed when any battery cell 111 in the assembled battery 110 becomes overcharged so as to store the overcharge information corresponding to the particular battery cell 111 into the storage unit 180, corresponds to the functions of the overcharge decision-making unit 152 and the storage control unit 153. The explosion-proofing mechanism actuation diagnostic processing, executed when the vehicle system is started up so as to make a decision, based upon overcharge information stored in the storage unit 180, as to whether or not any explosion-proofing mechanism has been actuated, corresponds to the function of the explosion-proofing decision-making unit 155.

Figure 5:
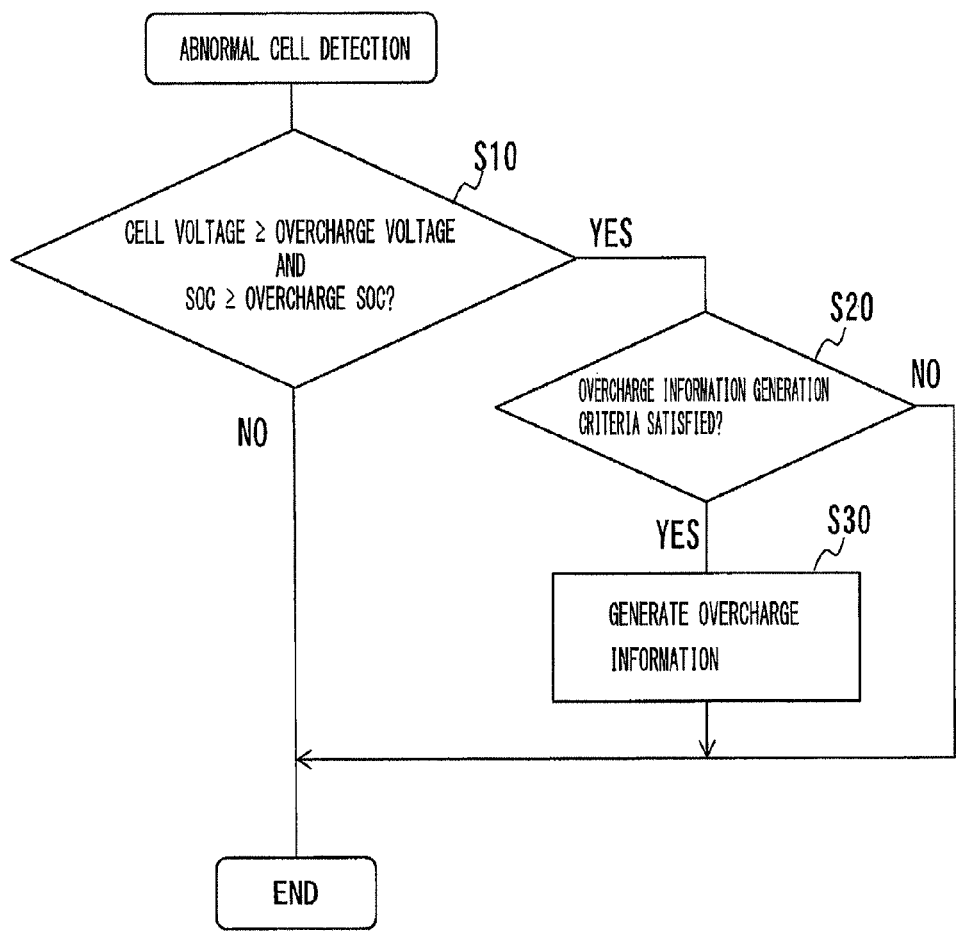

FIG. 5 presents a flowchart of the abnormal cell detection processing executed in the first embodiment of the present invention. The abnormal cell detection processing is executed as shown in the flowchart by the assembled battery control unit 150 over predetermined processing cycles.

In step S10, the assembled battery control unit 150 engages the overcharge decision-making unit 152 in operation so as to make a decision as to whether or not the individual battery cells 111 are each in an overcharge state. More specifically, it compares the cell voltage at each battery cell 111, measured by the corresponding cell voltage detection unit 122, with a predetermined overcharge voltage and makes a decision as to whether or not the cell voltage at any battery cell 111 is equal to or higher than the overcharge voltage. In addition, it compares the SOC values calculated by the SOC calculation unit 151 in correspondence to the individual battery cells 111 with a predetermined overcharge SOC value and makes a decision as to whether or not the SOC value at any battery cell 111 is equal to or greater than the overcharge SOC value. If there is a battery cell 111 that satisfies both of these decision-making criteria, the particular battery cell 111 is judged to be in an overcharge state, and the operation proceeds to step S20. If, on the other hand, there is no battery cell 111 satisfying both the decision-making criteria, it is decided that none of the battery cells 111 is in an overcharge state and in this case, the abnormal cell detection processing in the flowchart presented in FIG. 5 ends.

It is desirable that the overcharge voltage value and the overcharge SOC value used in the decision-making executed in step S10 be determined based upon the characteristics and the like of the battery cells 111. The overcharge voltage value and the overcharge SOC value may be set to, for instance, 4.6 V and 99% respectively.

In step S20, the assembled battery control unit 150 makes a decision as to whether or not specific overcharge information generation criteria are satisfied. Upon deciding that the overcharge information generation criteria are satisfied, the operation proceeds to step S30, whereas upon deciding that the overcharge information generation criteria are not satisfied, the abnormal cell detection processing in the flowchart presented in FIG. 5 ends.

The decision-making in step S20 may be executed based upon the number of sets of overcharge information having already been generated, the cell voltage at the battery cell 111 and the like. For instance, assuming that up to five sets of overcharge information can be stored into the storage unit 180 through a single trip, the overcharge information generation criteria are judged to be satisfied if the number of sets of overcharge information having already been generated through the processing in step S30, as will be explained later, is fewer than five. If, on the other hand, at least five sets of overcharge information have already been generated, the cell voltage obtained, in correspondence to the battery cell 111 determined in step S10 to be in an overcharge state, is compared with the lowest cell voltage among the cell voltages indicated in the previously generated overcharge information. If the comparison results indicate that the cell voltage, obtained in correspondence to the battery cell 111 is higher, it is decided that the overcharge information generation criteria are satisfied but otherwise, it is decided that the overcharge information generation criteria are not satisfied. Through these measures, up to five sets of overcharge information indicating the highest cell voltages can be generated per trip.

In step S30, the assembled battery control unit 150 engages the storage control unit 153 in operation so as to generate overcharge information for the battery cell 111 having been determined to be in an overcharge state in step S10. It is to be noted that if the maximum number of sets of overcharge information has already been generated, one of the five sets of overcharge information should be replaced with the overcharge information generated at this time.

FIG. 6 is a chart presenting an example of the overcharge information generated through step S30. The overcharge information presented in FIG. 6 includes various types of information pertaining to the overcharge state at the battery cell 111, such as cell number information, cell voltage information, SOC information and counter information.

As the cell number information, which is used to identify the battery cell 111 in the overcharge state, a specific value falling into a range of 1 through 40, corresponding to the position taken by the battery cell in the assembled battery 110 is set. It is to be noted that if a plurality of battery cells 111 are judged to be in an overcharge state at the same time, the cell number assigned to the battery cell with the highest cell voltage among the plurality of battery cells 111 should be set. While the assembled battery 110 is configured with 40 battery cells 111 in this example, the assembled battery 110 may be configured with a different number of battery cells 111 and, in such a case, a cell number falling into the range corresponding to the particular number of battery cells 111 configuring the assembled battery 110 will be set for the cell number information.

As the cell voltage information indicating the cell voltage at the battery cell 111 in an overcharge state, the cell voltage value measured by the cell voltage detection unit 122 is set with a resolution of 1 mV. It is to be noted that it may be set with a resolution other than this.

As the SOC information indicating the SOC at the battery cell 111 in an overcharge state, the SOC value calculated by the SOC calculation unit 151 is set with a 0.1% resolution. It is to be noted that the SOC value may be indicated with a resolution other than this.

As the counter information used to identify the specific trip during which the battery cell 111 has entered the overcharge state, a count value indicating the number of startups having occurred at the battery system 100 since the battery system 100 was first used, i.e., the number of trips, is set.

In step S30 in FIG. 5, overcharge information such as that described above is generated by the storage control unit 153. It is to be noted that as long as the overcharge information enables identification of the battery cell 111 that has entered the overcharge state, particulars pertaining to the content of the overcharge information are not limited to those in FIG. 6.

Once the overcharge information is generated in step S30, the assembled battery control unit 150 ends the abnormal cell detection processing shown in the flowchart presented in FIG. 6. The overcharge information having been generated is stored on a temporary basis into a buffer memory (not shown) in the assembled battery control unit 150. Subsequently, as the vehicle traveling operation ends and an instruction for turning off the battery control system 120 is issued, the overcharge information is output via the storage control unit 153 from the assembled battery control unit 150 to the storage unit 180 for storage. Through this process, the storage control unit 153 is able to store the overcharge information pertaining to the overcharge state at the battery cell 111 into the storage unit 180. It is to be noted that the overcharge information having been generated may be immediately stored into the storage unit 180 without waiting for the vehicle to stop.

Figure 7:
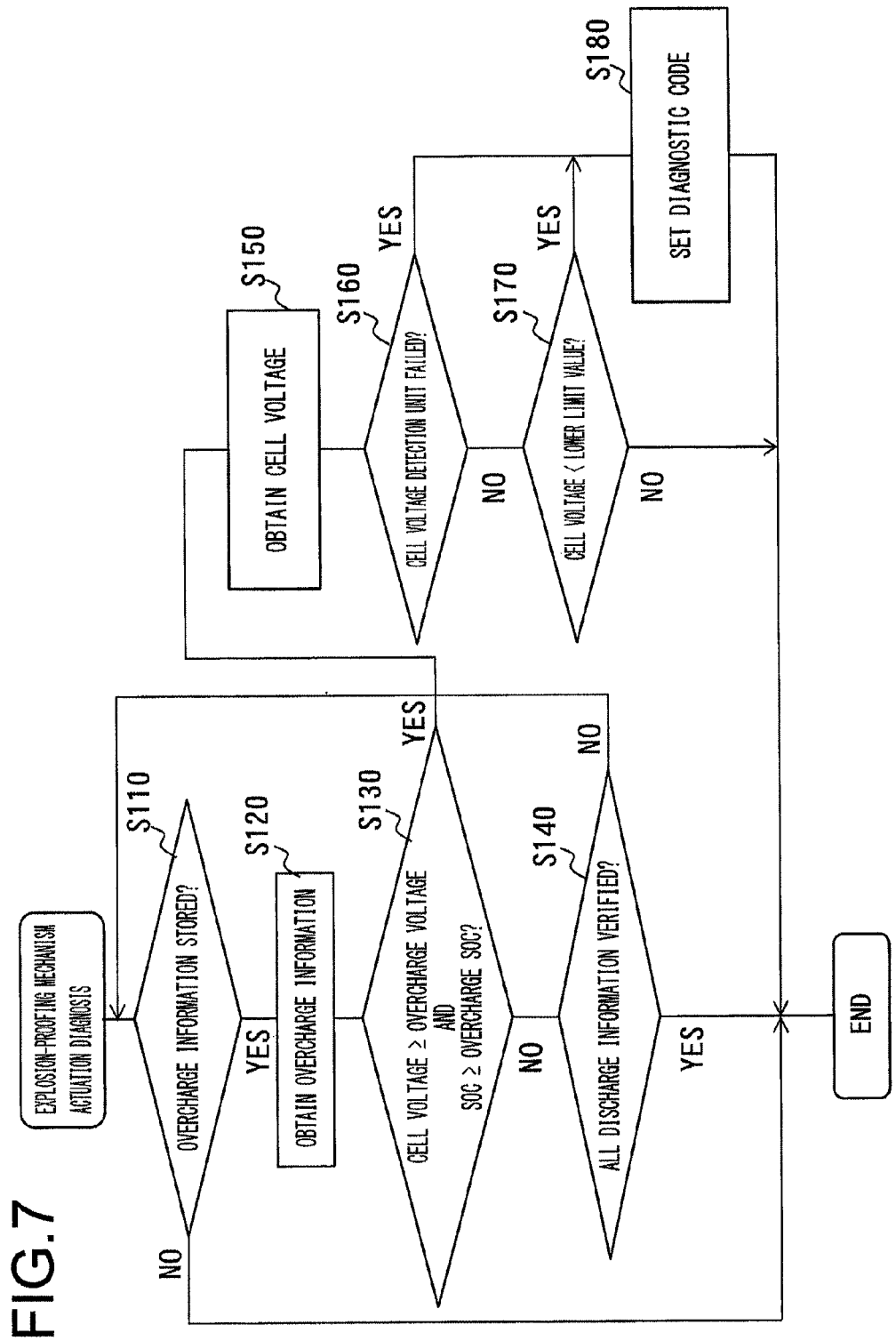

FIG. 7 presents a flowchart of the explosion-proofing mechanism actuation diagnostic processing executed in the first embodiment of the present invention. The explosion-proofing mechanism actuation diagnostic processing is executed as shown in the flowchart by the assembled battery control unit 150 when the battery control system 120 is started up.

In step S110, the assembled battery control unit 150 engages the explosion-proofing decision-making unit 155 in operation so as to make a decision as to whether or not any overcharge information is stored in the storage unit 180. If overcharge information is stored, the operation proceeds to step S120, whereas if no overcharge information is stored, the explosion-proofing mechanism actuation diagnostic processing in the flowchart presented in FIG. 7 ends.

In step S120, the assembled battery control unit 150 obtains the overcharge information from the storage unit 180. It is to be noted that if a plurality of sets of overcharge information is allowed to be stored into the storage unit 180 for a single trip, as described earlier, the overcharge information may be obtained one set at a time or the plurality of sets of overcharge information may be obtained in a batch.

In step S130, the assembled battery control unit 150 verifies each set of overcharge information obtained in step S120 by using verification criteria similar to the decision-making criteria used in step S10 in FIG. 5. In more specific terms, it compares the cell voltage indicated in the overcharge information with a predetermined overcharge voltage value so as to check whether or not the cell voltage is equal to or higher than the overcharge voltage. In addition, it compares the SOC value indicated in the overcharge information with a predetermined overcharge SOC value so as to check whether or not the SOC value is equal to or greater than the overcharge SOC value. If these verification criteria are both satisfied, the overcharge information having been obtained is judged to be correct and the operation proceeds to step S150. On the other hand, if only either of the verification criteria is satisfied or neither are satisfied, the overcharge information having been obtained is judged to be incorrect and in this case, the operation proceeds to step S140.

In step S140, the assembled battery control unit 150 makes a decision as to whether or not all the sets of overcharge information have been verified. If all the sets of overcharge information stored in the storage unit 180 have been verified through the processing executed in step S130 as described above, the explosion-proofing mechanism actuation diagnosis processing in the flowchart presented in FIG. 7 ends. If, on the other hand, there is still a set of overcharge information yet to undergo verification, the operation returns to step S110.

It is to be noted that the processing in steps S130 and S140 described above may be omitted. Namely, upon executing the processing in step S120 after deciding in step S110 that overcharge information is stored in the storage unit 180, the operation may directly proceed to step S150.

In step S150, the assembled battery control unit 150 obtains the current cell voltage at the battery cell 111, in correspondence to which the overcharge information has been obtained in step S120. More specifically, based upon the cell number indicated in the overcharge information, the battery cell 111 in the overcharge state is identified. Then, the cell voltage value at the identified battery cell 111, among the cell voltage values corresponding to the individual battery cells 111 transmitted from the battery cell control units 121a and 121b at startup of the battery control system 120, is extracted. Through this process, the current cell voltage corresponding to the battery cell 111 having been in an overcharge state is obtained.

In steps S160 and S170, the assembled battery control unit 150 engages the explosion-proofing decision-making unit 155 so as to make a decision as to whether or not the explosion-proofing mechanism in the battery cell 111, having been in an overcharge state, has actuated. More specifically, in step S160, a decision is made based upon the failure detection results provided by the failure detection unit 154 as to whether or not the cell voltage detection unit 122 is malfunctioning in the battery cell control unit 121a or 121b corresponding to the battery cell 111 having been in an overcharge state. Through this step, decision as to whether or not the explosion-proofing mechanism has actuated can be made. Namely, if failure detection results indicating that the cell voltage detection unit 122 in the particular battery cell control unit is malfunctioning are output from the failure detection unit 154, it is decided that the explosion-proofing mechanism in the battery cell 111 has actuated and the operation proceeds to step S180. If, on the other hand, such failure detection results are not output from the failure detection unit 154, the operation proceeds to step S170.

In step S170, a decision is made as to whether or not the explosion-proofing mechanism has actuated by comparing the cell voltage obtained in step S150 with a predetermined lower limit value. When the explosion-proofing mechanism in a battery cell 111 actuates and the electric current is cut off, the cell voltage at the battery cell 111 is lowered to a level substantially equal to 0V. Accordingly, a voltage lower than the cell voltage corresponding to the lowest SOC, e.g., 1.25V is set in advance as the lower limit value, and if the cell voltage having been obtained is under the lower limit value, it is decided that the explosion-proofing mechanism in the battery cell 111 has actuated and the operation proceeds to step S180. However, if the cell voltage is equal to or higher than the lower limit value, it is decided that the explosion-proofing mechanism in the battery cell 111 has not actuated and in this case, the explosion-proofing mechanism actuation diagnostic processing in the flowchart presented in FIG. 7 ends.

In step S180, the assembled battery control unit 150 internally sets a predetermined diagnostic code indicating that the explosion-proofing mechanism in the battery cell 111 has actuated. This diagnostic code is output from the assembled battery control unit 150 to the vehicle control unit 200 as needed and is reported to the user of the vehicle or the maintenance personnel. Information that enables identification of the battery cell 111 where the explosion-proofing mechanism has actuated and the like may be output together with the diagnostic code at this time. Once step S180 has been executed, the assembled battery control unit 150 ends the explosion-proofing mechanism actuation diagnostic processing in the flowchart presented in FIG. 7.

The following operations and advantages are achieved through the first embodiment of the present invention described above.

(1) The battery control system 120, connected to battery cells 111 each equipped with an explosion-proofing mechanism that cuts off an electric current in an overcharge state, controls the conditions at the battery cells 111. The battery control system 120 comprises battery cell control units 121a and 121b, each having a cell voltage detection unit 122 that detects cell voltages at battery cells 111, a storage unit 180 that stores information pertaining to the conditions at the battery cells 111, and an assembled battery control unit 150. The assembled battery control unit 150 has functions fulfilled in the form of an overcharge decision-making unit 152 that makes a decision as to whether or not the battery cells 111 are each in an overcharge state, a storage control unit 153 that stores overcharge information, which pertains to an overcharge state at a battery cell 111 determined to be in an overcharge state by the overcharge decision-making unit 152, into the storage unit 180, and an explosion-proofing decision-making unit 155. If overcharge information is already stored in the storage unit 180 (step S110) at a startup of the battery control system 120 and the cell voltage detected by the cell voltage detection unit 122 is lower than a predetermined lower limit value (step S170), the explosion-proofing decision-making unit 155 judges that the explosion-proofing mechanism in the corresponding battery cell 111 has actuated and sets a predetermined diagnostic code (step S180). Through these measures, a reliable decision with respect to actuation of an explosion-proofing mechanism in the battery system 100, having battery cells 111 each equipped with an explosion-proofing mechanism, can be made.

(2) The assembled battery control unit 150 in the battery control system 120 has a further function fulfilled in the form of a failure detection unit 154 that detects a failure in a cell voltage detection unit 122. If overcharge information is already stored in the storage unit 180 (step S110) at a startup of the battery control system 120 and a failure in the corresponding cell voltage detection unit 122 is detected by the failure detection unit 154 (step S160), the explosion-proofing decision-making unit 155 also sets the predetermined diagnostic code in step S180 by judging that the explosion-proofing mechanism in the corresponding battery cell 111 has actuated. Through these measures, even when a battery cell 111 becomes overcharged to result in a failure in the cell voltage detection unit 122 and thus normal cell voltage detection is no longer possible, and an accurate decision can be made with regard to explosion-proofing mechanism actuation.

(3) The assembled battery control unit 150 in the battery control system 120 has a further function fulfilled in the form of an SOC calculation unit 151 that calculates SOC values for the battery cells 111. If the cell voltage detected at a battery cell 111 by the cell voltage detection unit 122 is equal to or higher than a predetermined overcharge voltage and the SOC value calculated for the battery cell 111 by the SOC calculation unit 151 is equal to or greater than a predetermined overcharge SOC, the overcharge decision-making unit 152 judges that the battery cell 111 is in an overcharge state (step S10). Through this process, the overcharge decision-making unit 152 is able to make a reliable decision as to whether the battery cell 111 is in an overcharge state.

Second Embodiment

The second embodiment of the present invention will be described next. In this embodiment, the abnormal cell detection processing is executed through a procedure different from that described in reference to FIG. 5.

Figure 8:
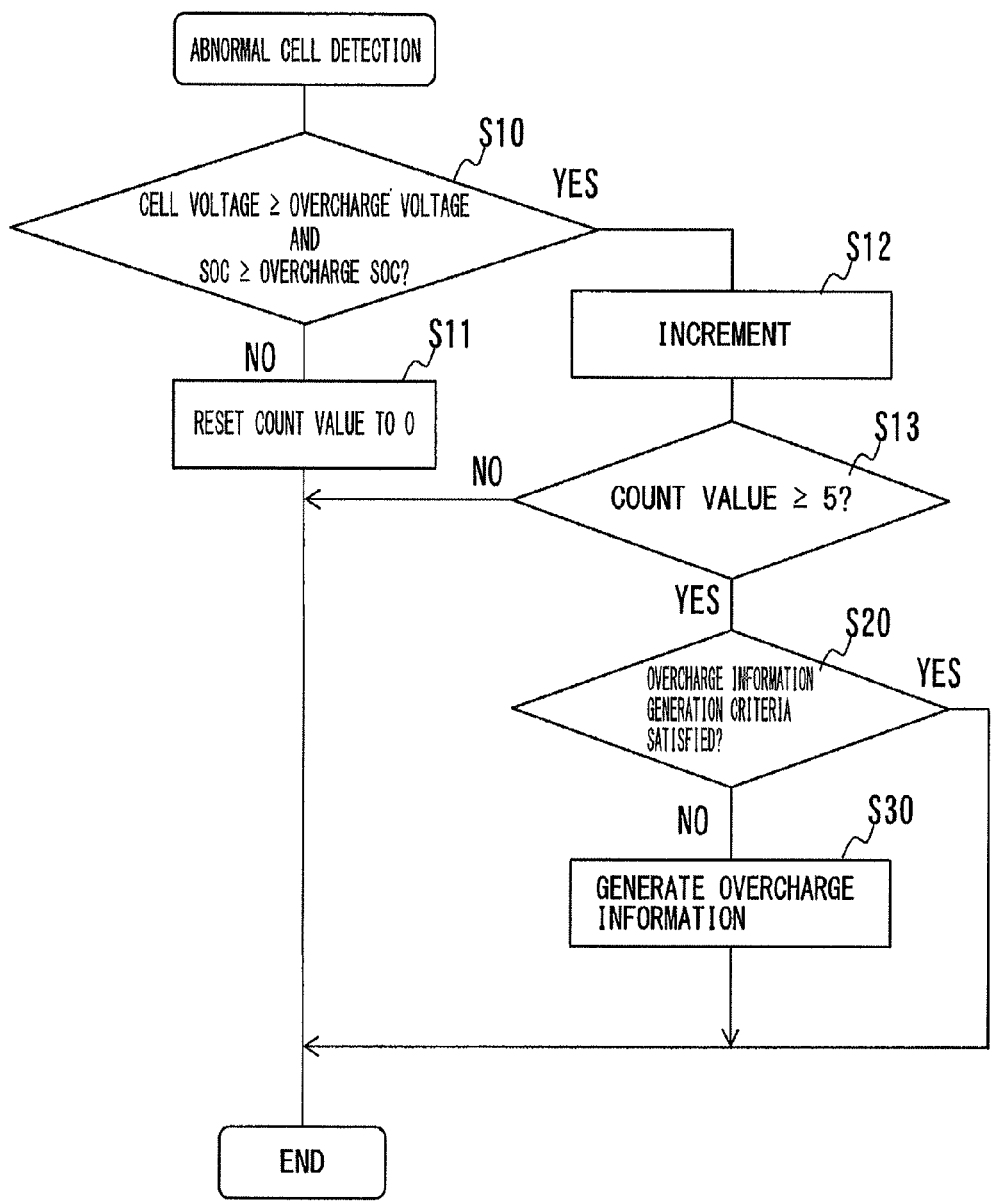

FIG. 8 presents a flowchart of the abnormal cell detection processing executed in the second embodiment of the present invention. The abnormal cell detection processing is executed as shown in the flowchart by the assembled battery control unit 150 over predetermined processing cycles. It is to be noted that in FIG. 8, the same step numbers as those in FIG. 5 are assigned to steps in which processing identical to that executed in the first embodiment, as shown in FIG. 5, is executed. Unless specifically required, processing executed in steps assigned with the same step numbers as those in FIG. 5 will not be explained below.

In step S10, the assembled battery control unit 150 executes decision-making processing similar to that in FIG. 5 by using the two decision-making criteria explained earlier. If there is no battery cell 111 satisfying the decision-making criteria, the operation proceeds to step S11, whereas if any battery cell 111 satisfies the decision-making criteria, the operation proceeds to step S12.

In step S11, the assembled battery control unit 150 sets an internal count value to 0. Thus, unless the decision-making criteria are determined to be satisfied in step S10, the count value, which may have been set to 1 or more, is reset to 0.

In step S12, the assembled battery control unit 150 increments the internally set count value by 1.

In step S13, the assembled battery control unit 150 makes a decision via the overcharge decision-making unit 152 as to whether or not the count value, incremented in step S12, is equal to or greater than a predetermined threshold value of, for instance, 5. If the count value is equal to or greater than 5, the particular battery cell 111 is judged to be in an overcharge state and the operation proceeds to step S20. If, on the other hand, the count value is smaller than 5, it is decided that the battery cell 111 is not in an overcharge state and the abnormal cell detection processing in the flowchart presented in FIG. 8 ends.

In this embodiment, when the decision-making criteria are successively satisfied five times in step S10 through the processing described above, the battery cell 111 is determined to be in an overcharge state and the processing in step S20 and the subsequent step is executed. Namely, assuming that each processing cycle extends over 100 ms, the overcharge decision-making unit 152 decides that the battery cell 111 is in an overcharge state if the decision-making criteria are satisfied continuously over a period of time equal to or longer than 500 ms, i.e., five times the length of the processing cycle.

It is to be noted that while the threshold for the count value is set to 5 and thus the battery cell 111 is determined to be in an overcharge state by the overcharge decision-making unit 152 when the decision-making criteria are satisfied continuously over a period of time equal to or longer than a time length equivalent to five times the processing cycle in the example presented above, a different time length may be used for the reference time length. Namely, any length of time may be selected for the overcharge state decision-making and the threshold for the count value may be selected in correspondence to the value set for the time length.

In the second embodiment of the present invention described above, the overcharge decision-making unit 152 decides that a battery cell 111 is in an overcharge state if the cell voltage thereat is sustained at a level equal to or greater than the overcharge voltage over a period of time equal to or greater than the predetermined time length and the SOC value calculated by the SOC calculation unit 151 is equal to or greater than the predetermined overcharge SOC value (steps S10, S11, S12 and S13). Through these measures, it is ensured that even when a cell voltage equal to or higher than the overcharge voltage is temporarily detected at a battery cell 111 that is not in an overcharge state due to, for instance, a disconnection at a voltage detection line installed between the cell voltage detection unit 122 and the battery cell 111, the battery cell 111 is not erroneously judged to be in an overcharge state.

Third Embodiment

The third embodiment of the present invention will be described next. In this embodiment, the explosion-proofing mechanism actuation diagnostic processing is executed through a procedure different from that described in reference to FIG. 7.

Figure 9:
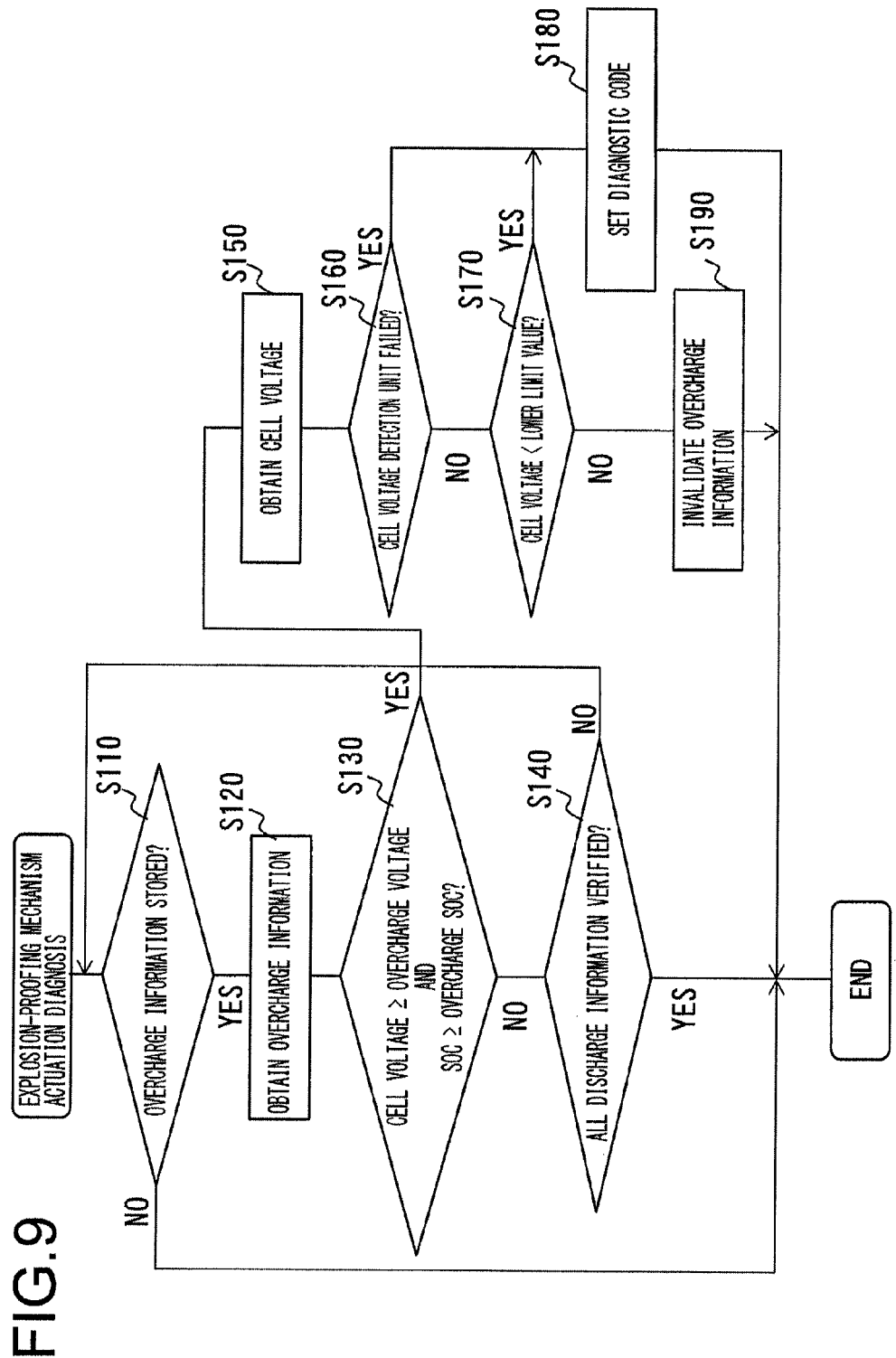

FIG. 9 presents a flowchart of the explosion-proofing mechanism actuation diagnostic processing executed in the third embodiment of the present invention. The explosion-proofing mechanism actuation diagnostic processing is executed as shown in the flowchart by the assembled battery control unit 150 when the battery control system 120 is started up. It is to be noted that in FIG. 9, the same step numbers as those in FIG. 7 are assigned to steps in which processing identical to that executed in the first embodiment, as shown in FIG. 7, is executed. Unless specifically required, processing executed in steps assigned with the same step numbers as those in FIG. 7 will not be explained below.

In step S170, the assembled battery control unit 150 executes decision-making processing similar to that shown in FIG. 7. If the cell voltage having been obtained is equal to or higher than a predetermined lower limit value, it is decided that the explosion-proofing mechanism in the battery cell 111 has not actuated, and the operation proceeds to step S190.

In step S190, the assembled battery control unit 150 invalidates the overcharge information, among the sets of overcharge information stored in the storage unit 180, that corresponds to the battery cell 111, the cell voltage at which determined to be equal to or higher than the lower limit value in step S170. The overcharge information may be invalidated by, for instance, erasing the particular set of overcharge information from the storage unit 180. As an alternative, the counter value shown in FIG. 6, for instance, may be recorded in another recording medium or the like as information to be used to identify the overcharge information to be invalidated and the overcharge information may be invalidated by searching for overcharge information to be designated as a processing target in the subsequent processing based upon this information. When the storage unit 180 is configured with a flash memory, it is not possible to selectively erase only part of the information recorded therein, and thus, it is desirable to invalidate overcharge information through the alternative method described above.

In the third embodiment of the present invention described above, if it is decided by the explosion-proofing decision-making unit 155 through the steps S160 and S170 that the explosion-proofing mechanism has not been actuated even though overcharge information is already stored in the storage unit 180 at startup of the battery control system 120, the assembled battery control unit 150 invalidates the overcharge information stored in the storage unit 180 (step S190). Through these measures, it is ensured that a communication error attributable to noise or the like at the time of startup does not lead to an erroneous decision that the explosion-proofing mechanism has actuated if the explosion-proofing mechanism has not actually actuated at the battery cell 111 having entered an overcharge state.

It is to be noted that some of or all of the control blocks in the assembled battery control unit 150 shown in FIG. 4, which are involved in the explosion-proofing mechanism actuation decision-making in the embodiments described above, may be allocated in the vehicle control unit 200. For instance, the explosion-proofing decision-making unit 155 may be located in the vehicle control unit 200 instead of the assembled battery control unit 150. In such a case, the assembled battery control unit 150 transmits information indicating the failure detection results obtained from the failure detection unit 154 to the vehicle control unit 200. Based upon the failure detection results transmitted from the assembled battery control unit 150 and the overcharge information stored in the storage unit 180, the vehicle control unit 200 engages the explosion-proofing decision-making unit 155 in operation so as to make a decision as to whether or not the explosion-proofing mechanism in a battery cell 111 has actuated through the procedure shown in the flowchart presented in FIG. 7 or FIG. 9. Through these alternative measures, too, operations and advantages similar to those having been described earlier can be achieved.

It is to be noted that the present invention is in no way limited to the particulars of the embodiments and variations thereof described above, and any other mode conceivable within the technical range of the present invention should be considered to be within the scope of the present invention.

In addition, all or some of the various structural elements and the various functions described above may be achieved in hardware by using, for instance, an integrated circuit or as a program or software executed by a processor. Information such as a program, a table and the like, needed to enable the various functions, may be stored in a storage device such as a memory or a hard disk, or in a storage medium such as an IC card or a DVD.

The disclosure of the following priority application is herein incorporated by reference: Japanese Patent Application No. 2013-166803, filed Aug. 9, 2013

REFERENCE SIGNS LIST

100: battery system, 110: assembled battery, 111: battery cell, 112a, 112b: battery cell group, 120: battery control system, 121a, 121b: battery cell control unit, 122: cell voltage detection unit, 123: control circuit, 124: signal input/output circuit, 125: temperature detection unit, 130: current detection unit, 140: total voltage detection unit, 150: assembled battery control unit, 151: SOC calculation unit, 152: overcharge decision-making unit, 153: storage control unit, 154: failure detection unit, 155: explosion-proofing decision-making unit, 160: signal communication path, 170: insulator element, 180: storage unit, 200: vehicle control unit, 300, 310, 320, 330: relay, 400: inverter, 410: motor generator, 420: charger

The invention claimed is:

1. A battery control system connected to a battery equipped with an explosion-proofing mechanism for cutting off an electric current when the battery enters an overcharge state, which controls conditions at the battery, comprising:
   a cell voltage detection unit that detects a cell voltage at the battery;
   a storage unit that stores information pertaining to the conditions at the battery;
   an overcharge decision-making unit that makes a decision as to whether or not the battery is in an overcharge state;
   a storage control unit that engages the storage unit to store overcharge information pertaining to the overcharge state at the battery when the overcharge decision-making unit decides that the battery is in an overcharge state; and
   an explosion-proofing decision-making unit that decides that the explosion-proofing mechanism in the battery has actuated if the overcharge information is stored in the storage unit at startup of the battery control system and the cell voltage detected by the cell voltage detection unit is lower than a predetermined lower limit value.

2. The battery control system according to claim 1, further comprising:
   a failure detection unit that detects a failure in the cell voltage detection unit, wherein:
   the explosion-proofing decision-making unit also decides that the explosion-proofing mechanism in the battery has actuated if the overcharge information is stored in the storage unit at startup of the battery control system and a failure at the cell voltage detection unit is detected by the failure detection unit.

3. The battery control system according to claim 1, further comprising:
   an SOC calculation unit that calculates an SOC value for the battery, wherein:
   the overcharge decision-making unit decides that the battery is in an overcharge state if the cell voltage detected by the cell voltage detection unit is equal to or higher than a predetermined overcharge voltage and the SOC value calculated by the SOC calculation unit is equal to or greater than a predetermined overcharge SOC.

4. The battery control system according to claim 3, wherein:
   the overcharge decision-making unit decides that the battery is in an overcharge state if a state in which the cell voltage is equal to or higher than the overcharge voltage has been sustained for a length of time equal to or longer than a predetermined time length and the SOC value calculated by the SOC calculation unit is equal to or greater than the predetermined overcharge SOC.

5. The battery control system according to claim 1, wherein:
   the overcharge information stored in the storage unit at startup of the battery control system is invalidated if the explosion-proofing decision-making unit decides that the explosion-proofing mechanism has not actuated.

6. A vehicle control system, comprising:
   a battery control system connected to a battery equipped with an explosion-proofing mechanism for cutting off an electric current when the battery enters an overcharge state, which controls conditions at the battery; and
   a vehicle control unit, connected with the battery control system, which controls traveling conditions of a vehicle, wherein:
   the battery control system comprises
      a cell voltage detection unit that detects a cell voltage at the battery,
      a storage unit that stores information pertaining to the conditions at the battery,
      an overcharge decision-making unit that makes a decision as to whether or not the battery is in an overcharge state, and
      a storage control unit that engages the storage unit to store overcharge information pertaining to the overcharge state at the battery when the overcharge decision-making unit decides that the battery is in an overcharge state; and
   the vehicle control unit decides that the explosion-proofing mechanism in the battery has actuated if the overcharge information is stored in the storage unit at startup of the vehicle and the cell voltage detected by the cell voltage detection unit is lower than a predetermined lower limit value.

* * * * *